US009029985B2

(12) United States Patent
Driscoll et al.

(10) Patent No.: US 9,029,985 B2
(45) Date of Patent: May 12, 2015

(54) MEMRISTOR COMPRISING FILM WITH COMB-LIKE STRUCTURE OF NANOCOLUMNS OF METAL OXIDE EMBEDDED IN A METAL OXIDE MATRIX

(71) Applicant: Los Alamos National Security, LLC, Los Alamos, NM (US)

(72) Inventors: Judith L. Driscoll, Cambridge (GB); ShinBuhm Lee, Oak Ridge, CA (US); Quanxi Jia, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 14/282,910

(22) Filed: May 20, 2014

(65) Prior Publication Data
US 2014/0346423 A1    Nov. 27, 2014

Related U.S. Application Data

(60) Provisional application No. 61/826,753, filed on May 23, 2013.

(51) Int. Cl.
| | |
|---|---|
| *H01L 29/12* | (2006.01) |
| *H01L 45/00* | (2006.01) |
| *G11C 13/00* | (2006.01) |
| *C09K 11/02* | (2006.01) |

(52) U.S. Cl.
CPC .......... *H01L 45/147* (2013.01); *H01L 45/1608* (2013.01); *H01L 45/146* (2013.01); *G11C 13/0007* (2013.01); *G09G 2300/0842* (2013.01); *C09K 11/02* (2013.01)

(58) Field of Classification Search
CPC ........................ C09K 11/02; G09G 2300/0842
USPC .................................... 257/536, 537, E29.003
See application file for complete search history.

(56) References Cited

U.S. PATENT DOCUMENTS

| | | | | |
|---|---|---|---|---|
| 8,501,621 | B2 * | 8/2013 | Kochergin | 438/658 |
| 8,502,343 | B1 * | 8/2013 | Jha et al. | 257/537 |
| 2006/0289942 | A1 * | 12/2006 | Horii et al. | 257/379 |
| 2012/0105159 | A1 * | 5/2012 | Strachan et al. | 331/2 |
| 2014/0113828 | A1 * | 4/2014 | Gilbert et al. | 505/100 |
| 2014/0293678 | A1 * | 10/2014 | Orlowski et al. | 365/148 |

OTHER PUBLICATIONS

Borghetti et al., "Memristive' switches enable 'stateful' logic operations via material implication," Nature, 2010, vol. 464, pp. 873-876, published Apr. 2010.
Chang et al., "Oxide Double-Layer Nanocrossbar for Ultrahigh-Density Bipolar Resistive Memory," Adv. Mater., Sep. 2011, vol. 23, pp. 4063-4067.

(Continued)

*Primary Examiner* — John C Ingham
(74) *Attorney, Agent, or Firm* — Samuel L. Borkowsky

(57) ABSTRACT

Films having a comb-like structure of nanocolumns of $Sm_2O_3$ embedded in a $SrTiO_3$ formed spontaneously on a substrate surface by pulsed laser deposition. In an embodiment, the nanocolumns had a width of about 20 nm with spaces between nanocolumns of about 10 nm. The films exhibited memristive behavior, and were extremely uniform and tunable. Oxygen deficiencies were located at vertical interfaces between the nanocolumns and the matrix. The substrates may be single-layered or multilayered.

20 Claims, 8 Drawing Sheets

(56) References Cited

OTHER PUBLICATIONS

Chanthbouala et al., "A ferroelectric memristor," Nature Mater., 2012, vol. 11, pp. 860-864, published online Sep. 16, 2012.

Chen et al., "A size-dependent nanoscale metal-insulator transition in random materials," Nature Nanotechnol., 2011, vol. 6, pp. 237-241, published online Feb. 27, 2011.

Driscoll et al., "Memory Metamaterials," Science, 2009, vol. 325, pp. 1518-1521 published Sep. 2009.

Garcia-Barriocanal el al., "Colossal ionic conductivity at interfaces of epitaxial ZrO2:Y2O3/SrTiO3 heterostructures," Science, 2008, vol. 321, pp. 676-680, published Aug. 1, 2008.

Hsieh et al., "Local Conduction at the BiFeO3—CoFe2O4 Tubular Oxide Interface," Adv. Mater., Jul. 2012, vol. 24, pp. 4564-4568.

International Technology Roadmap for Semiconductors (ITRS). Emerging Research Devices. ITRS technical report (http://www.itrs.net) (2011).

Kim et al., "Ferroelectric Tunnel Memristor," Nano Lett., 2012, vol. 12, pp. 5697-5702, published Oct. 5, 2012.

Lee, M.-J. et al., "A fast, high-endurance and scalable non-volatile memory device made from asymmetric Ta2O5-x/TaO2-x bilayer structures," Nature Mater., 2011, vol. 10, pp. 625-630, published online Jul. 10, 2011.

McGibbon et al., "Direct Determination of Grain Boundary Atomic Structure in SrTiO3," Science, 1994, vol. 266, pp. 102-104, published Oct. 1994.

Menzel et al., "Origin of the Ultra-nonlinear Switching Kinetics in Oxide-Based Resistive Switches," Adv. Funct. Mater., Dec. 6, 2011, vol. 21, pp. 4487-4492.

Miao et al., "Observation of two resistance switching modes in TiO2 memristive devices electroformed at low current," Nanotechnology, 2011, vol. 22, pp. 254007-1 through 254007-7, published May 16, 2011.

Muenstermann et at "Coexistence of Filamentary and Homogeneous Resistive Switching in Fe-doped SrTiO3 Thin-Film Memristive Devices," Adv. Mater., Aug. 27, 2010, vol. 22, pp. 4819-4822.

Nian et al., "Evidence for an Oxygen Diffusion Model for the Electric Pulse Induced Resistance Change Effect in Transition-Metal Oxides," Phys. Rev. Lett., 2007, vol. 98, pp. 146403-1 through 146403-4, published Apr. 4, 2007.

Pennycook et al., "Origin of colossal ionic conductivity in oxide multilayers: interface induced sublattice disorder," Phys. Rev. Lett., 2010, vol. 104, pp. 115901-1 through 115901-4, published Mar. 2010.

Pickett et al., "A scalable neuristor built with Mott memristors," Nature Mater., 2013, vol. 12, pp. 114-117, published online Dec. 12, 2012.

Prodromakis et al., "Two centuries of memristors," Nature Mater., 2012, vol. 11, pp. 478-481, published Jun. 2012.

Rozenberg et al., "Nonvolatile Memory with Multilevel Switching: a Basic Model," Phys. Rev. Lett., 2004, vol. 92, pp. 178302-1 through 178302-4, published Apr. 30, 2004.

Schroeder et al., "Voltage-time dilemma of pure electronic mechanisms in resistive switching," J. Appl. Phys., 2010, vol. 107, pp. 054517-1 through 054517-8, published online Mar. 2010.

Shao et al., "Low-Temperature Resistance Anomaly at SrTiO3 Grain Boundaries: Evidence for an Interface-Induced Phase Transition," Phys. Rev. Lett., 2005, vol. 95, pp. 197601-1 through 197601-4, published Nov. 3, 2005.

Shibuya et al., "Impact of Defect Distribution on Resistive Switching Characteristics of Sr2TiO4 Thin Films," Adv. Mater., Jan. 19, 2010, vol. 22, pp. 411-414.

Steele et al., "Materials for fuel-cell technologies," Nature, 2001, vol. 414, pp. 345-352, published Nov. 2001.

Strachan et al., "Direct Identification of the Conducting Channels in a Functioning Memristive Device," Adv. Mater., Aug. 24, 2010, vol. 22, pp. 3573-3577.

Strukov et al., "Exponential ionic drift: fast switching and low volatility of thin-film memristors," Appl. Phys. A, 2009, vol. 94, pp. 515-519, published online Nov. 28, 2008.

Strukov et al., "The missing memristor found," Nature, 2008, vol. 453, pp. 80-83, published May 1, 2008.

Varela et al., "STEM-EELS imaging of complex oxides and interfaces," MRS Bulletin, 2010, vol. 37, pp. 29-35, published Jan. 2012.

Wachsman et al., "Lowering the Temperature of Solid Oxide Fuel Cells," Science, 2011, vol. 334, pp. 935-939, published Nov. 18, 2011.

Waser et al., "Redox-based resistive switching memories—nanoionic mechanisms, prospects, and challenges," Adv. Mater., Jul. 13, 2009, vol. 21, pp. 2632-2663.

Waser et al., "Nanoionics-based resistive switching memories," Nature Mater., 2007, vol. 6, pp. 833-840, published Nov. 2007.

Yang et al. "The mechanism of electroforming of metal oxide memristive switches," Nanotechnology, 2009, vol. 20, pp. 215201-1 through 215201-9, published May 5, 2009.

Yang et al., "Memristive switching mechanism for metal/oxide/metal nanodevices," Nature Nanotechnol., 2008, vol. 3, pp. 429-433, published online Jun. 15, 2008.

Yang et al., "Memristive devices for computing," Nature Nanotechnol., 2013, vol. 8, pp. 13-24, published online Dec. 27, 2012.

\* cited by examiner

Fig. 7a
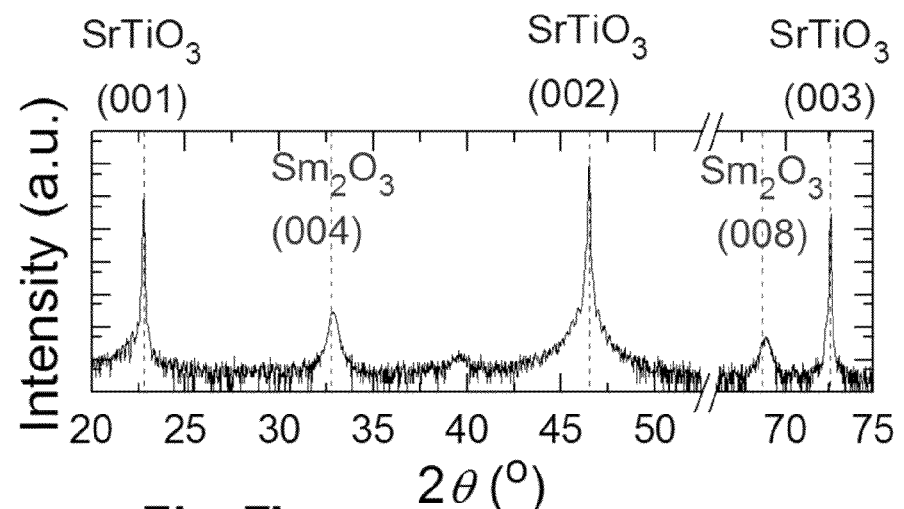
Fig. 7b
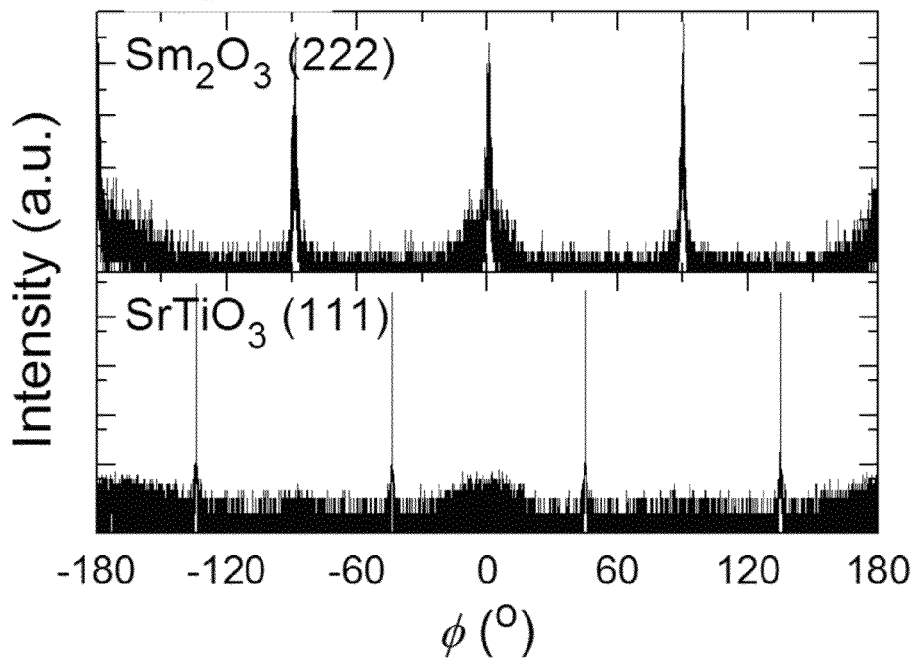
*Fig. 7*

MEMRISTOR COMPRISING FILM WITH COMB-LIKE STRUCTURE OF NANOCOLUMNS OF METAL OXIDE EMBEDDED IN A METAL OXIDE MATRIX

PRIORITY CLAIM TO A RELATED APPLICATION

This application claims the benefit of U.S. Provisional Patent Application Ser. No. 61/826,753 entitled "Memristor Comprising Film with Comb-Like Structure of Nanocolumns of Metal Oxide Embedded in a Metal Oxide Matrix," filed May 23, 2013, which is incorporated by reference herein.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present invention relates generally to the preparation of memristors having nanocolumns of a first metal oxide embedded in a matrix of a second metal oxide.

BACKGROUND OF THE INVENTION

A memristor is a circuit element that can remember its previous state[1, 2]. Its main fingerprint is a pinched-hysteresis loop when subjected to bipolar periodic stimuli. This fingerprint has been observed in nanoionics [3-5], metal-insulator transitions [6, 7], and ferroelectric tunneling [8, 9]. The discovery of nanoionic memristive signals has prompted much research because of possible applications of memristors in terabit memories [10, 11], logic operators [12], and neuristors [13, 14].

A physical mechanism which is responsible for memristive behavior of conventional nanoionic memristors has been reported [1, 3-5, 10, 11]. The mechanism is believed to involve coupled electron-ion dynamics involving changes in the electronic barrier at an interface under an electric field. These changes are believed to result from oxygen deficient channels in the material. Single-phase binary or ternary metal oxides in their virgin states do not contain these channels, but application of a suitable voltage to the virgin sample has been found to initiate memristive behavior [15, 16]. The application of a voltage or current to the virgin sample suitable for initiating memristive behavior is known in the art as 'electroforming'. Nanoionic circuit elements that can operate at room temperature have not yet been prepared by any process other than electroforming.

However, there are problems associated with the use of electroforming to provide memristive behavior because electroforming is a destructive process with a random and uncontrollable nature [11, 15, 17]. Samples may be damaged or destroyed by the high voltage or current [15], and memristors prepared by electroforming may also suffer from problems of non-uniformity and non-reproducibility [11, 17].

Other approaches besides electroforming have been explored for the creation of these oxygen deficient channels in metal oxide samples. One alternative approach for forming oxygen deficient channels in single phase oxide materials is a partial substitution approach [18, 19] that has been used mainly for preparing oxide electrolytes for solid oxide fuel cells and oxygen sensors that operate at temperatures above 650° C. The other approach involves the preparation of lateral multilayered structures [20]. Although this second approach provides large concentrations of oxygen vacancies distributed throughout lateral interfaces [21, 22], it is not readily adaptable for preparing circuit elements because current flowing in lateral directions results in both the poor integration density and the processing difficulty in device fabrication.

SUMMARY OF THE INVENTION

In accordance with the purposes of the present invention, as embodied and broadly described herein, the present invention includes an article comprising a substrate having a surface, and a film on the surface of the substrate, the film comprising a plurality of aligned nanocolumns of $Sm_2O_3$ embedded in a matrix of $SrTiO_3$.

The present invention also includes an article prepared by a process comprising providing a target material comprising a mixture of $Sm_2O_3$ and $SrTiO_3$, and using the target material to deposit a film onto a surface of a substrate by pulsed laser deposition, the film comprising a plurality of aligned nanocolumns of $Sm_2O_3$ embedded in a matrix $SrTiO_3$.

The present invention also includes an article comprising a substrate having a surface and a film on the surface of the substrate. The film comprises a plurality of nanocolumns of a first metal oxide material embedded in a matrix of a second metal oxide material. The film is further characterized as having an interface region separating the nanocolumns from the matrix. The interface region is further characterized as providing an oxygen deficient channel that is suitable for providing the article with memristive behavior.

BRIEF DESCRIPTION OF THE DRAWINGS

The accompanying drawings, which are incorporated in and form a part of the specification, illustrate the embodiments of the present invention and together with the description serve to explain the principles of the invention. In the drawings:

FIG. 2a provides multilevel resistance-voltage (R-V) curves for the memristor. FIG. 2b provides a curve showing a uniform resistance variation with repeated electrical cycles. FIGS. 2c and 2d provide curves showing systematic tunable resistances of a high resistance state (HRS) and a low-resistance state (LRS) by varying film thickness and laser repetition rate.

FIG. 3a shows a side-view of the nanoscaffold $SrTiO_3$:$Sm_2O_3$ film. The dark matrix is $SrTiO_3$. The bright columns are $Sm_2O_3$. The film structure forms spontaneously by pulsed laser deposition. FIG. 3b shows a high-angle annular dark-field (HAADF) cross-sectional-view of vertical interface of $SrTiO_3$ matrix and $Sm_2O_3$ nanocolumn. FIG. 3c shows an image obtained from crystallographic modeling of a portion of FIG. 3b. FIG. 3d shows a HAADF plan-view image of the $SrTiO_3$ matrix and a $Sm_2O_3$ nanocolumn. FIG. 3e shows a concentration profile of Sm, Ti and O (open circles) elements across the vertical interface, the profile measured using the electron energy loss spectroscopy (EELS). Shown in solid circles is the calculated EELS signal of O element with assumption of stoichiometric O elements, i.e. O/Ti=3 and O/Sm=1.5, in $SrTiO_3$ matrix and $Sm_2O_3$ nanocolumn respectively. The calculated energy-dispersive x-ray spectroscopy (EDS) signal of O is higher than the measured value when close to the interface, which indicates an oxygen deficiency at the vertical interface between the matrix and the nanocolumn.

FIG. 4a shows current-voltage (I-V) curves at interface (triangles) and inside nanocolumns (squares) using conductive atomic force microscopy. The inset shows the surface topography. FIG. 4b shows conductance of nanoscaffold $SrTiO_3$:$Sm_2O_3$ film (circles), single $SrTiO_3$ (triangles) and $Sm_2O_3$ (squares) thin films in a temperature range from 20° C. to 550° C.

FIG. 5a shows thermally activated behavior of T-dependence of nonlinear transient time $\tau$ for T-variation from 18° C. to 70° C. The inset shows gradual decrease of resistance linearly with time. FIGS. 5b and 5c show voltage amplitude $V_p$-dependence of $\tau$ for $V_p$-variation to 6 V. The nonlinearity of $V_p$-$\tau$ dependences becomes much enhanced with increase of T and decrease of film thickness.

FIG. 6a shows a HAADF image in plan-view. The matrix and nanocolumns correspond to the dark and bright contrasts. The rectangular area is tested. FIG. 6b shows atomic element mapping using EDS. The EDS image clearly shows distribution of Sm, Sr, and Ti atoms. The bright and dark contrasts are assigned to $Sm_2O_3$ nanocolumns and $SrTiO_3$ matrix, respectively.

FIGS. 7a and 7b show results of a crystallographic investigation of a nanoscaffold $SrTiO_3$:$Sm_2O_3$ film using x-ray diffraction. FIG. 7a shows out-of-plane epitaxial relationship investigation by $\omega$-2$\theta$ scan. All of the observed peaks correspond to (00l) peaks of $SrTiO_3$ and $Sm_2O_3$, indicating preferential orientation of $Sm_2O_3$ film on Nb-doped $SrTiO_3$ substrate. The (00l) peaks of $SrTiO_3$ film cannot be distinguished from those of Nb-doped $SrTiO_3$ substrate. FIG. 7b shows in-plane epitaxial relationship investigation by phi scan. The top and bottom panels show 360° phi scans of the $Sm_2O_3$ (222) film and $SrTiO_3$ (111) substrate reflections. The film and substrate peaks are separated by 45°, revealing the in-plane relationship of $Sm_2O_3$[110]||$SrTiO_3$[100].

DETAILED DESCRIPTION

Figure 1:
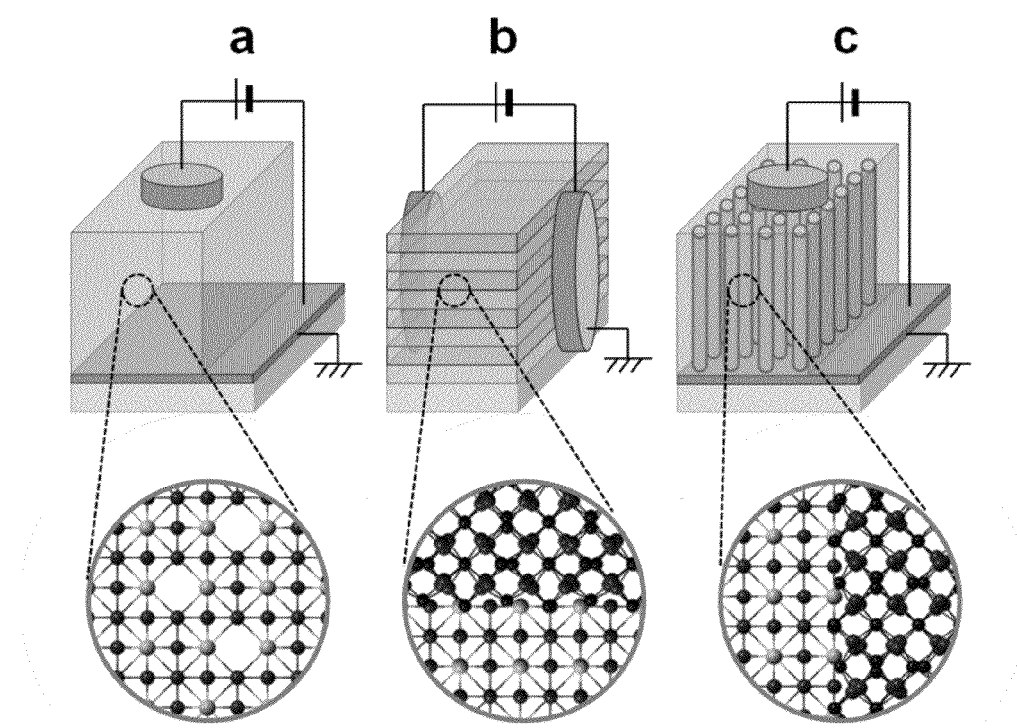
FIG. 1a shows a schematic diagram of a conventional single-phase oxide film partially substituted with dopants.
FIG. 1b shows a schematic diagram of a conventional multi-layer film with oxygen disorder at lateral interfaces between dissimilar crystal structures.
FIG. 1c shows a schematic diagram of an embodiment film with oxygen disorder at the vertical interfaces between dissimilar crystal structures described in this application.

Articles having memristive behavior were prepared by pulsed laser deposition of a metal oxide target onto a substrate. Unlike conventional memristors comprised of single phase metal oxides (FIG. 1a) and multilayered devices (FIG. 1b), embodiments prepared by pulsed laser deposition according to the present invention resulted a film that formed on the substrate spontaneously with nanocolumns of a first metal oxide embedded in a matrix of a second metal oxide (FIG. 1c).

In an embodiment, a film deposited on a (001) Nb-doped $SrTiO_3$ substrate had a comb-like structure of nanocolumns of cubic $Sm_2O_3$ embedded in a matrix of $SrTiO_3$. Sometimes the terms "comb-like' and 'nanoscaffold' are used interchangeably herein to describe the structures of nanocolumns embedded in a matrix. These structures formed spontaneously on the substrate using suitably chosen metal oxide precursors under suitable conditions. Memristors of $Sm_2O_3$ nanocolumns embedded in a matrix of $SrTiO_3$ were deposited by pulsed laser deposition onto $SrTiO_3$ substrates doped with 1 atomic percent Nb. A polycrystalline target containing a 50:50 weight percent mixture of $SrTiO_3$ and $Sm_2O_3$ was used. A KrF laser ($\lambda$=248 nm) with a fluence of 1.5 J/cm$^2$ and a repetition rate of 1-10 Hz was used. The films were grown at a substrate temperature of 800° C. and an oxygen pressure of 0.2 mbar. The samples were cooled in 400 mbar $O_2$ to obtain proper oxygen stoichiometry and minimize the creation of oxygen vacancies inside the films. Circular Pt electrodes of 50-μm-radius defined by shadow masks were deposited by DC-magnetron sputtering onto the $SrTiO_3$:$Sm_2O_3$ nanoscaffold films.

The films were characterized using a variety of techniques, including X-ray diffraction, resistance measurements, scanning probe microscopy, and atomic scale mapping using energy-dispersive x-ray spectroscopy (EDS) and electron energy loss spectroscopy (EELS).

X-ray diffraction was carried out with a PANALYTICAL EMPYREAN high resolution x-ray diffractometer using Cu—K$\alpha$ radiation ($\lambda$=1.5405 Å). X-ray reflectivity was employed to measure the film thickness.

Resistances were measured using a two-probe station and a KEITHLEY 2440 source-meter. For all electrical measurements, the Nb-doped $SrTiO_3$ substrate was grounded, and a voltage was applied to the Pt electrodes. Pulses of 16 ms in duration were applied due to a limitation of pulse duration for the computer-controlled KEITHLEY 2440 source-meter. A THURLBY & THANDAR TG1304 programmable function generator and a TEKTRONIX TDS210 two channel digital real-time oscilloscope were used to observe sub-10 ns switching behaviors of the devices. To measure electrical characteristics with temperature variation from 20° C. to 550° C., a probe station equipped with a hot plate was used. To investigate local conduction at vertical interfaces, an Agilent 5500 scanning probe microscope was used. Commercial silicon tips coated with chromium/platinum were used for conductive AFM.

A FEI TITAN™ G2 80-200 STEM with a Cs probe corrector and ChemiSTEM™ technology (X-FEG™ and SuperX™ EDS with four windowless silicon drift detectors operated at 200 kV) was used to evaluate both the structural and chemical properties across the interface. The instrument was also equipped with GATAN EELS system (QUANTUM SE/963) for EELS analysis. For atomic-scale chemical mapping (EDS or EELS), the spectral imaging data were acquired along the $SrTiO_3$ [100] zone axis with an electron probe of size less than 0.18 nm, convergence angle of 18.4 mrad and current of approximately 100 pA. HAADF images were recorded under similar optical conditions with an annular detector having collection range of 60-160 mrad. EELS spectral imaging was acquired with a detector semi-angle of about 15 mrad.

Figure 2:
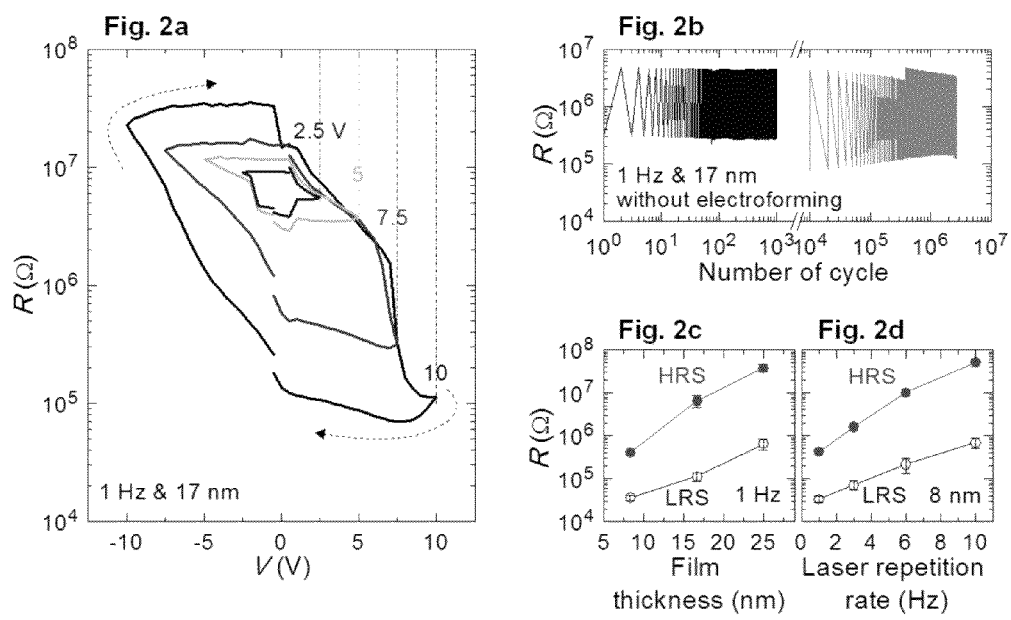
FIGS. 2a, 2b, 2c, and 2d show various memristive characteristics of an embodiment $SrTiO_3$:$Sm_2O_3$ memristor.

FIG. 2a shows memristive resistance-voltage (R-V) curves of nanoscaffold $SrTiO_3:Sm_2O_3$ films. Electrodes were circular Pt with 50-μm-radius. The films were highly insulating (approximately 10 MΩ) in their virgin state. When a small positive voltage was applied, the virgin state was switched into low-resistance state (LRS). When a small negative voltage was applied, the device in the LRS could be switched back into the high-resistance state (HRS). When voltages of +10 V and −10 V were applied, as displayed by the figure (the large loop), non-volatile resistances of LRS and HRS at 0.1 V were approximately 100 kΩ and approximately 10 MΩ, respectively, with a ratio of approximately 100.

Similar memristive R-V curves were also observed in other nanoscaffold films such as a nanoscaffold film of $Ba_{0.6}Sr_{0.4}TiO_3:Sm_2O_3$ and a nanoscaffold film of $BaTiO_3:Sm_2O_3$. We could obtain a broad range of intermediate resistance states because the resistance switching occurs gradually. The inner concentric loops in FIG. 2a (with bias voltage from 10 V to 2.5 V) show that the ratio of high and low resistances can be finely tuned, depending on the amplitude of applied voltage. This opens a possible way to realize multi-level data storage memory.

The memristive behavior occurred without the use of electroforming. Indeed, the resistance of HRS was very similar to that of the virgin state even after many repeated electrical cycles.

The memristive behavior in the embodiment films was superior to that observed for single-phase oxide memristors in following aspects. (1) The resistance variation with repeated electrical cycles (i.e. endurance) was extremely uniform in the embodiment films. We applied sequential voltage pulses of +10 V and −10 V to switch the resistance state and +0.1 V between each voltage pulse to read the resistance. The excellent uniform resistance variations last for over $10^3$-cycles, as shown by a black line in FIG. 2b. In addition, after one month, the device retained the original resistance state without obvious degradation. As shown by the grey line, the device still revealed excellent uniform resistance variations over $10^6$ cycles with a similar resistance ratio. In addition, the memristive R-V curves were reproducible from device to device. (2) The resistances of HRS and LRS were tunable by varying deposition conditions. FIGS. 2c and d show large variations of resistance with orders of magnitude change when we varied either the film thickness or the laser repetition rate during film deposition, respectively. We can easily obtain a resistance corresponding to an optimum current level (e.g. approximately $10^{-6}$ A) for both low power consumption and reliable information sensing [10, 23].

The realization of the above-mentioned properties in one device was highlighted in recent reports [11, 17] as the most difficult problem in single-phase oxide memristors because of the belief that electroforming was necessary for preparing the devices. To the best of our knowledge, embodiment memristors of the present invention are the first that demonstrate these properties in one device.

Figure 3:
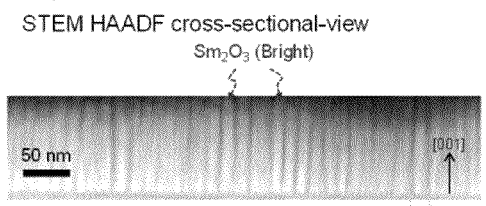
FIGS. 3a, 3b, 3c, 3d, and 3e relate to forming oxygen deficient channels at vertical interfaces of an embodiment memristor having $Sm_2O_3$ nanocolumns embedded in a $SrTiO_3$ matrix. The oxygen deficient channels result from structural incompatibility at the interfaces between the $SrTiO_3$ matrix and the $Sm_2O_3$ nanocolumns.
Figure 3:
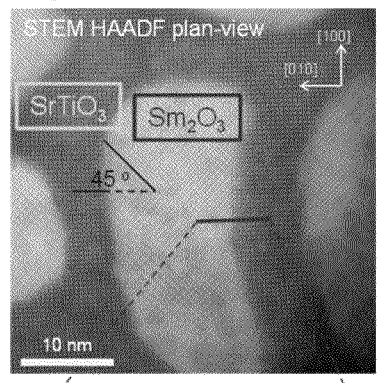
Figure 3:
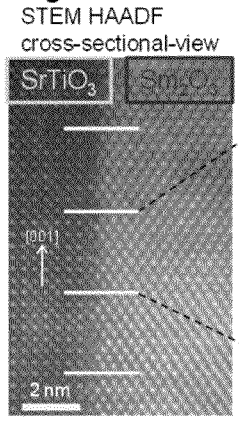
Figure 3:
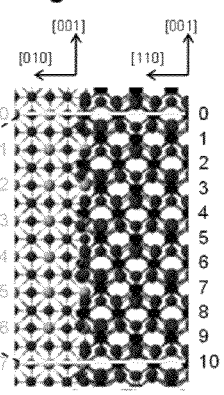
Figure 3:
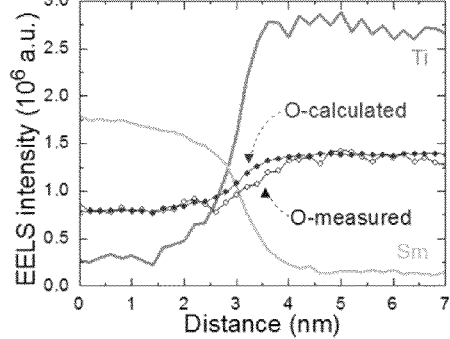

An atomic reconstruction at the vertical interfaces was examined using STEM in a nanoscaffold $SrTiO_3:Sm_2O_3$ film. FIG. 3a shows spontaneous phase ordering in the cross-sectional images of the film, with alternating dark and bright contrast regions of approximately 10-nm-width. The 100-nm-long bright nanocolumns were extremely straight. Thus, sharp vertical interfaces were preserved between the nanocolumns and matrix. A surface topographical image obtained using atomic force microscopy (AFM) showed a homogenous distribution of nanopillars over at least 1×1 μm². Energy-dispersive x-ray spectroscopy (EDS) was used to assign dark and bright contrast to the $SrTiO_3$ matrix and $Sm_2O_3$ nanocolumns.

FIG. 3b shows a high-angle annular dark-field (HAADF) image of the vertical interface. The atomic resolution for the image shows a sharp interface between $SrTiO_3$ and $Sm_2O_3$. The $Sm_2O_3$ phase grew on the Nb-doped $SrTiO_3$ substrate with a 45° in-plane rotation to minimize their mismatch. This explanation is also supported by an x-ray diffraction phi-scan across the surface of the material, as shown in FIG. 7.

An atomic reconstruction at the vertical interface showed that every $11^{th}$ Sm atomic plane was perfectly matched with the SrO layer of every $8^{th}$ consecutive $SrTiO_3$ unit cell shown in FIG. 3c.

It is our belief that oxygen deficient channels are located at interfaces separating the nanocolumns from the matrix, and that these oxygen deficient channels provide the article with memristive properties [24, 25]. To provide support for this hypothesis, the concentration profile of atomic elements across the vertical interface was measured using electron energy loss spectroscopy (EELS). FIG. 3e shows corresponding EELS signals for the line profile in HAADF plan-view image of FIG. 3d. The EELS signals of Sm and Ti elements were much stronger inside the $Sm_2O_3$ nanocolumn and the $SrTiO_3$ matrix, respectively. The EELS signals of Sm, Ti and O (open circles) changed steadily within an approximately 2-nm-wide interface region. To check the oxygen deficiency, we calculated the EELS signal of O, assuming stoichiometric O, i.e. O/Ti=3 and O/Sm=1.5, deeper inside the $SrTiO_3$ matrix and inside the $Sm_2O_3$ nanocolumn, respectively. The calculated EELS signal of O (solid circles) matches well with the measured values deeper inside the nanocolumns and the matrix. However, close to the interface, the calculated EELS signal of O is higher than the measured value, indicating oxygen deficiency at the vertical interface region.

Figure 4:
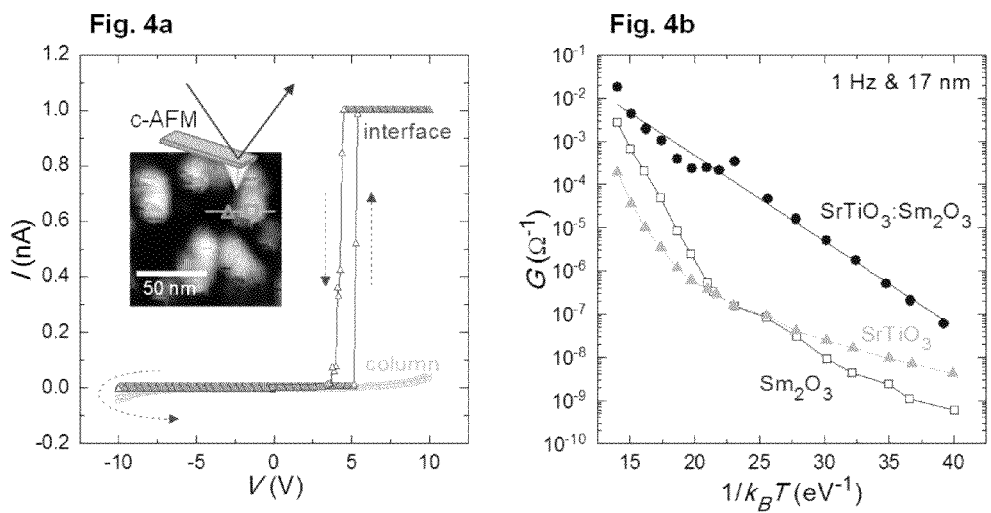
FIGS. 4a and 4b provide graphs illustrating local conduction at the vertical interface between the $SrTiO_3$ matrix and the $Sm_2O_3$ nanocolumn.
Figure 8:
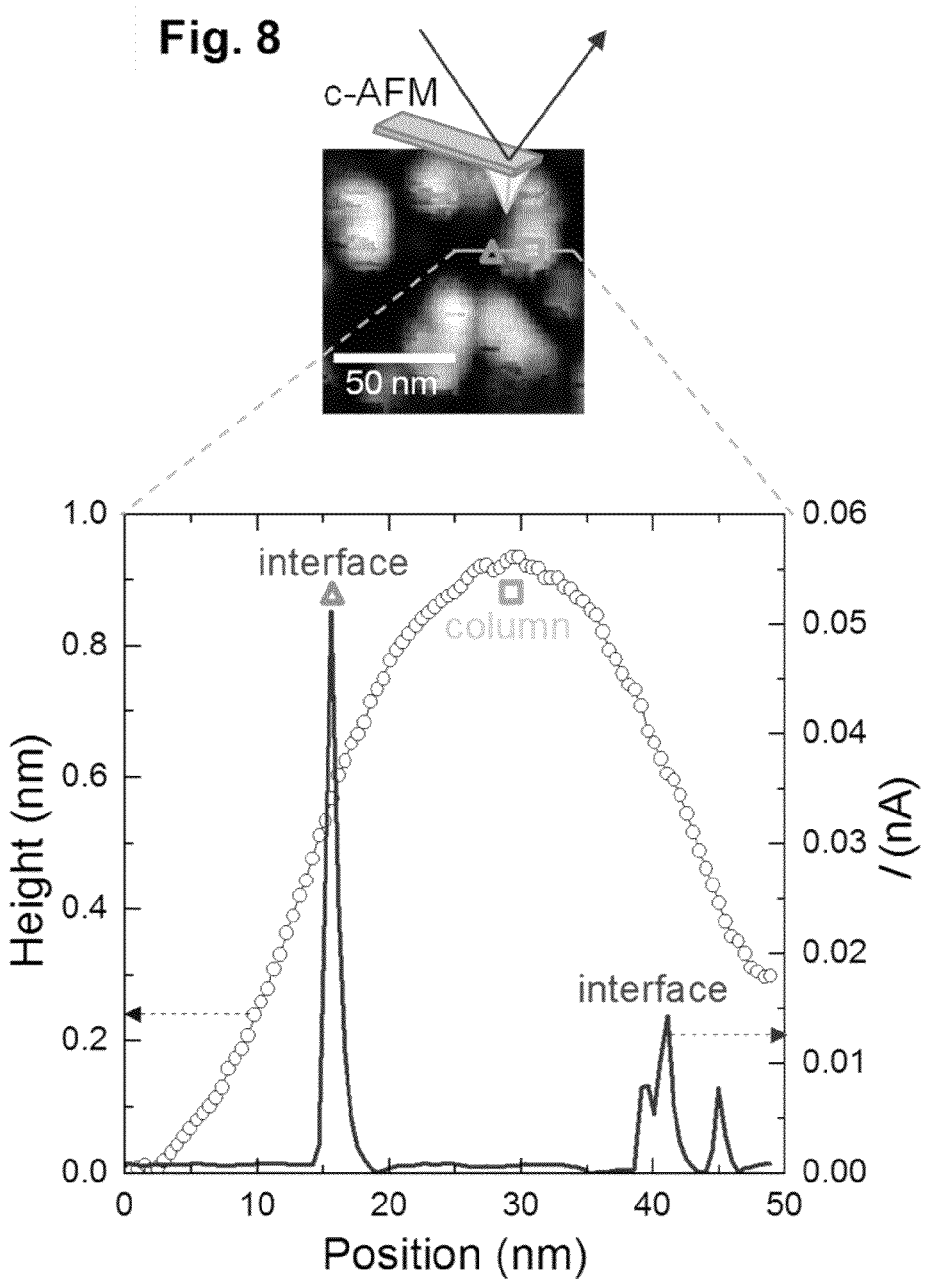
FIG. 8 shows local conduction (measured by a conductive atomic force microscopy or AFM) at the vertical interface between a $SrTiO_3$ matrix and a $Sm_2O_3$ nanocolumn. The upper figure shows surface topographical image in nanoscaffold $SrTiO_3$:$Sm_2O_3$ film. We measure a line profile of current flow marked on the image. Open circles and a solid line in the lower figure indicate the relative height of the surface and current flow, respectively. The current flow was significantly enhanced only at the interface.

To extract local information about the current flow path through the embodiment $SrTiO_3:Sm_2O_3$ films, we recorded a current-voltage (I-V) curve using conductive AFM with high lateral resolution. Unlike conventional multilayer devices where interfaces are buried (FIG. 1b), in an embodiment nanoscaffold structure the interfaces are accessible from the electrical contact [26] and so we were able to more easily probe the physical properties of the interfaces there. To distinguish between the interface and the nanocolumn of the studied sample, we first acquired the surface topography, as shown in the inset of FIG. 4a. We then measured the local current flow by moving a Pt-coated tip along the line shown in the image, which covers both interface and nanocolumn. It became clear that local current flow increased significantly only near the interface regions, as shown in FIG. 8. We then placed the Pt-coated tip at a position on the interface and on the nanocolumn, and swept the voltage from −10 V to 10 V in spectroscopic mode to record I-V curves at each position.

As clearly shown in FIG. 4a, the memristive I-V curve is detected only at the interface (triangles), and the nanocolumn (squares) is insulating.

We also compared the conductance of the embodiment nanoscaffold $SrTiO_3:Sm_2O_3$ memristor with that of single $SrTiO_3$ and $Sm_2O_3$ memristors in the 20° C. to 550° C. temperature range. As shown in FIG. 4b, the nanoscaffold $SrTiO_3:Sm_2O_3$ films (circles) show a markedly increased conductance for the entire temperature range, compared to the single $SrTiO_3$ (triangles) and $Sm_2O_3$ (squares) films. Both results indicate that a high concentration of oxygen deficiencies (i.e. oxygen deficient channels) can exist along the vertical interfaces, resulting in local current flow paths. Considering the extremely narrow interfaces of approximately 2-nm-width, it is believed that the embodiment nanoscaffold memristor can potentially lead to a memory density of 40 Tb/in$^2$ [27].

Although $V$ is widely accepted to play a significant role in the single-phase oxide memristors [1, 3-5], the origin of the $V$ concentration change is still under debate. Concerning this issue, there are two physical models proposed for single-phase oxide memristors: electron trap/detrap at immobile $V$ sites [28, 29] and drift of mobile $V$ [30]. The former involves trapping and de-trapping of electrons at fixed $V$ sites and corresponding changes of the electronic barrier at the metal/oxide interface. For the latter, the variation of the electronic barrier is attributed to the drift of mobile oxygen deficiencies (i.e. $V$) under electric fields. The latter model is acceptable to memristors working even at room temperature, considering an exponential increase of $V$ mobility by the Joule-heating-induced temperature increase in nanometer-scale area [31].

Figure 5:
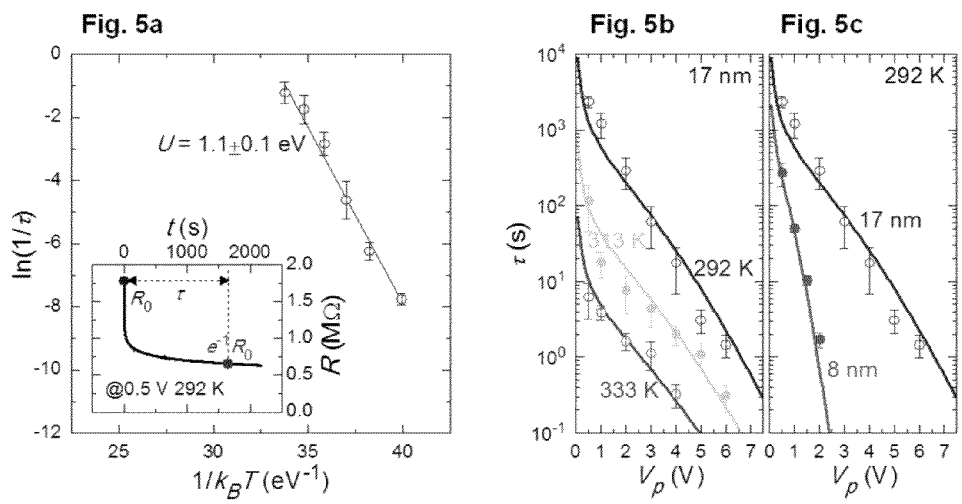
FIGS. 5a, 5b, and 5c illustrate nonlinear transient times ($\tau$) for high-to-low resistance switching.
Figure 6:
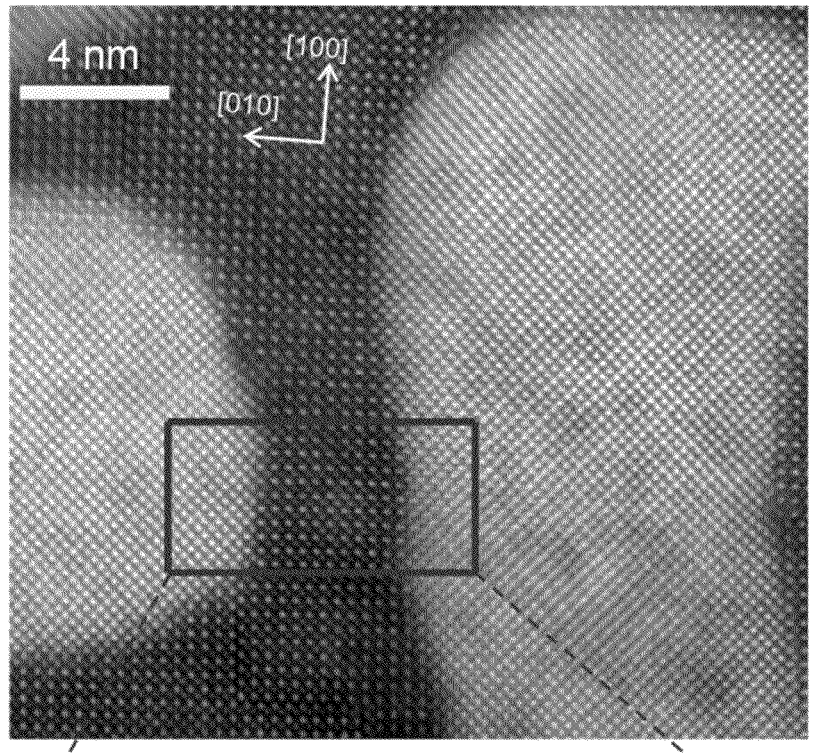
FIGS. 6a and 6b show spectroscopic imaging of atomic elements in a nanoscaffold $SrTiO_3$:$Sm_2O_3$ film using EDS.
Figure 6:
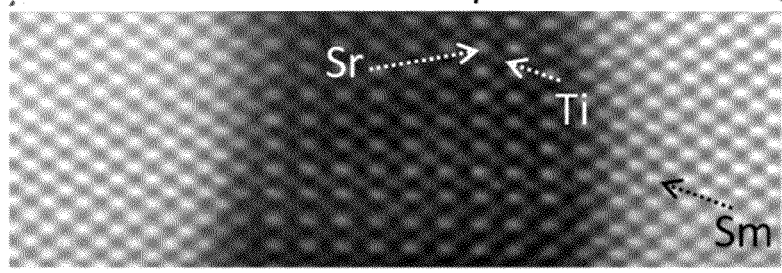

To gain insights into the memristive mechanism operating with the embodiment memristors, we analyzed the dynamics of high-to-low resistance switching. We measured the resistance variation R(t) by applying the voltage pulse with a constant amplitude of $V_p$ linearly over time t. For example, when we applied +0.5 V, the R(t) of HRS decreased gradually, as shown in the inset of FIG. 5a. Just as for other transient phenomena [32, 33], we can fit R(t) nicely using a stretched exponential law, i.e. $R(t)=R(0)\exp[-(t/\tau)^\alpha]$, where a represents a numeric exponent. Interestingly, R(t) at t=τ is always a constant value of R(0)/e independent of a, so we conveniently defined τ as the transient time. FIG. 5a shows a thermally activated behavior of T-dependence of τ when we changed temperature T from 18° C. to 70° C. It should be noted that the activation energy U of τ was determined to be 1.1±0.1 eV, based on an Arrhenius plot of 1/τ. The value of 1.1 eV agrees with the diffusion barrier of $V$ [5, 31, 33], suggesting that the drift of $V$ dominates the high-to-low resistance switching in our nanoscaffold memristor.

We found that τ decreased by more than five orders of magnitude, when we increased $V_p$ linearly within 6 V, as shown in FIGS. 5b and c. Different from the planar structure of FLASH memory, the conventional memristor has the vertical metal/insulator/metal structure. The writing/erasing and reading take place in the same direction [23], possibly disturbing the data storage by the reading operation. However, this so-called voltage-time dilemma can be overcome in memristive devices when their operating times behave non-linearly to the operating stimuli [31, 34]. The embodiment nanoscaffold memristor represents this case due to the significant nonlinearity of the $V_p$-τ relationship. Interestingly, this nonlinearity is significantly enhanced by not only increasing the T (FIG. 5b) but also decreasing the film thickness (FIG. 5c). By extrapolating from measured data of the 8-nm-thick device, we can predict that τ will decrease by thirteen orders of magnitude within 6 V. This possibility implies that the nonlinearity of the $V_p$-τ relationship becomes extremely steep with just a slight change of film thickness. To understand these dependences quantitatively, we calculated τ by considering the drift of mobile $V$ [31, 34], i.e.

$$\tau \sim \frac{d}{\mu(T_l)E_o}\left(\sinh\left(\frac{V}{dE_o}\right)\right)^{-1},$$

where μ corresponds to $V$ mobility, $E_o$=1 MV/cm to characteristic field, $T_l$ to local temperature, V to applied voltage and d to film thickness. We also considered an exponential increase of $\mu(T_l)$ by the Joule-heating-induced $T_l$ increase [31]. The calculated τ-values are in good agreement with the measured ones, as displayed by the solid lines in FIGS. 5b and c. These results clearly show a significant role of Joule-heating-accelerated drift of $V$ in the nanoscaffold memristor.

In conclusion, embodiment nanoscaffold memristors comprising nanocomposite films with comb-like structures were prepared. Oxygen deficient channels exist at the vertical interface regions between the nanocolumns and the matrix, likely resulting from a structural incompatibility between the oxide material of the nanocolumn and the oxide material of the matrix. Regularly distributed and spatially confined oxygen vacancies present in our films minimize the stray conduction paths otherwise observed in single-phase oxide memristors which are responsible for non-uniformity and non-reproducibility. Oxygen vacancy engineering at the nanoscale by means of nanoscaffold composite structures spatially confines the conduction paths at vertical interface regions and gives better control over the device performance with highly uniformity and reproducibility. Our experimental and theoretical results provide the fundamental basis for understanding nanoscaffold memristors. In addition, we have taken steps towards creating tunable physical functionalities, e.g. ionic transport and electrochemical phenomena, in vertical oxide heterointerfaces which may find wide applications in next-generation electronic devices. Thus, we provide a memristor in which we have engineered oxygen deficient channels in the memristor without having to use electroforming. The resulting films have a comb-like structure of nanocolumns embedded in a matrix. The performance of embodiment memristors are better than, and include new functionalities compared to, known memristors.

The foregoing description of the invention has been presented for purposes of illustration and description and is not intended to be exhaustive or to limit the invention to the precise form disclosed, and obviously many modifications and variations are possible in light of the above teaching. For example, a nanoscaffold film of $Ba_{0.6}Sr_{0.4}TiO_3$:$Sm_2O_3$ onto a (001) Nb-doped substrate was also prepared by pulsed laser deposition, and a nanoscaffold film of $BaTiO_3$:$Sm_2O_3$ onto (001) Nb-doped $SrTiO_3$ (i.e. Nb:$SrTiO_3$) substrate was also prepared using pulsed laser deposition. These other films were prepared using a suitable mixture of ingredients and they are believed to also be characterized as having interface regions between the nanocolumns of $Sm_2O_3$ and their corresponding matrices, wherein the interfaces are also believed to include oxygen deficient channels suitable for memristive behavior. Additionally, as to the substrate, while it is noted that the embodiments described herein employ substrates of Nb-doped $SrTiO_3$, it should be understood that other types of substrates may be used. For example, the nanoscaffold films may be deposited onto substrates that are themselves multilayers. In an embodiment, such a multilayer may contain a first layer of silicon, a second layer of silicon dioxide on the silicon layer, a third layer of IBAD-MgO (where IBAD means ion-beam assisted deposition) on the $SiO_2$ layer, and the fourth layer may be $SrRuO_3$ on the IBAD-MgO layer. Such a multilayer may be abbreviated as follows: $SrRuO_3$/IBAD-MgO/$SiO_2$/Si. In another embodiment multilayer may include a first layer of silicon, a second layer of silicon dioxide on the silicon layer, a third layer of IBAD-MgO on the silicon dioxide layer, and a fourth layer of niobium-doped $SrTiO_3$ on the IBAD-MgO layer. Such a multilayer may be abbreviated as follows: Nb:$SrTiO_3$/IBAD-MgO/$SiO_2$/Si. In yet another embodiment, a multilayer may include a first layer of silicon, a second layer of silicon dioxide on the silicon layer, a third layer of IBAD-MgO on the silicon dioxide layer, and a fourth layer $La_{0.5}Sr_{0.5}CoO_3$ on the layer of IBAD-MgO. In these embodiments of multilayered substrates, conductive $SrRuO_3$, $Nb:SrTiO_3$, and $La_{0.5}Sr_{0.5}CoO_3$, respectively, are in thin film form, and IBAD-MgO is used as a template for epitaxial growth of these conductive materials.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

REFERENCES

1. Strukov et al., "The missing memristor found," *Nature,* 453, pp. 80-83 (2008), published May 1, 2008.
2. Prodromakis et al., "Two centuries of memristors," *Nature Mater.* 11, pp. 478-481 (2012), published June 2012.
3. Waser et al., "Nanoionics-based resistive switching memories," *Nature Mater.* 6, pp. 833-840 (2007), published November 2007.
4. Yang et al., "Memristive switching mechanism for metal/oxide/metal nanodevices," *Nature Nanotechnol.* 3, pp. 429-433 (2008), published online Jun. 15, 2008.
5. Waser et al., "Redox-based resistive switching memories—nanoionic mechanisms, prospects, and challenges," *Adv. Mater.* 21, pp. 2632-2663 (2009).
6. Driscoll et al., "Memory Metamaterials," *Science* 325, pp. 1518-1521 (2009), published September 2009.
7. Chen et al., "A size-dependent nanoscale metal-insulator transition in random materials," *Nature Nanotechnol.* 6, pp. 237-241 (2011), published online Feb. 27, 2011.
8. Chanthbouala et al., "A ferroelectric memristor," *Nature Mater.* 11, pp. 860-864 (2012), published online Sep. 16, 2012.
9. Kim et al., "Ferroelectric Tunnel Memristor," *Nano Lett.* 12, pp. 5697-5702 (2012), published Oct. 5, 2012.
10. Lee, M.-J. et al. A fast, high-endurance and scalable non-volatile memory device made from asymmetric $Ta_2O_{5-x}/TaO_{2-x}$ bilayer structures. *Nature Mater.* 10, pp. 625-630 (2011), published online Jul. 10, 2011.
11. Yang et al., "Memristive devices for computing," *Nature Nanotechnol.* 8, pp. 13-24 (2013), published online Dec. 27, 2012.
12. Borghetti et al., "'Memristive' switches enable 'stateful' logic operations via material implication," *Nature* 464, pp. 873-876 (2010), published April 2010.
13. Koxma et al., et al., *Advances in Neuromorphic Memristor Science and Applications* (Springer, New York, 2012).
14. Pickett et al., "A scalable neuristor built with Mott memristors," *Nature Mater.* 12, pp. 114-117 (2013), published online Dec. 12, 2012.
15. Yang et al. "The mechanism of electroforming of metal oxide memristive switches," *Nanotechnology* 20, pp. 215201-1 through 215201-9 (2009), published May 5, 2009.
16. Strachan et al., "Direct Identification of the Conducting Channels in a Functioning Memristive Device," *Adv. Mater.* 22, pp. 3573-3577 (2010).
17. International Technology Roadmap for Semiconductors (ITRS). Emerging Research Devices. ITRS technical report (http://www.itrs.net) (2011).
18. Steele et al., "Materials for fuel-cell technologies," *Nature* 414, pp. 345-352 (2001), published November 2001.
19. Wachsman et al., "Lowering the Temperature of Solid Oxide Fuel Cells," *Science* 334, pp. 935-939 (2011), published Nov. 18, 2011.
20. Garcia-Barriocanal et al., "Colossal ionic conductivity at interfaces of epitaxial $ZrO_2:Y_2O_3/SrTiO_3$ heterostructures," *Science* 321, pp. 676-680 (2008), published Aug. 1, 2008.
21. Pennycook et al., "Origin of colossal ionic conductivity in oxide multilayers: interface induced sublattice disorder," *Phys. Rev. Lett.* 104, pp. 115901-1 through 115901-4 (2010), published March 2010.
22. Varela et al., "STEM-EELS imaging of complex oxides and interfaces," MRS Bulletin 37, pp. 29-35 (2012). Published January 2012.
23. Schroeder et al., "Voltage-time dilemma of pure electronic mechanisms in resistive switching," *J. Appl. Phys.* 107, pp. 054517-1 through 054517-8 (2010), published online March 2010.
24. McGibbon et al., "Direct Determination of Grain Boundary Atomic Structure in $SrTiO_3$," *Science* 266, pp. 102-104 (1994), published October 1994.
25. Shao et al., "Low-Temperature Resistance Anomaly at $SrTiO_3$ Grain Boundaries: Evidence for an Interface-Induced Phase Transition," *Phys. Rev. Lett.* 95, pp. 197601-1 through 197601-4 (2005), published Nov. 3, 2005.
26. Hsieh et al., "Local Conduction at the $BiFeO_3$—$CoFe_2O_4$ Tubular Oxide Interface," *Adv. Mater.* 24, pp. 4564-4568 (2012).
27. Chang et al., "Oxide Double-Layer Nanocrossbar for Ultrahigh-Density Bipolar Resistive Memory," *Adv. Mater.* 23, pp. 4063-4067 (2011).
28. Rozenberg et al., "Nonvolatile Memory with Multilevel Switching: a Basic Model," *Phys. Rev. Lett.* 92, 178302 (2004), published Apr. 30, 2004.
29. Shibuya et al., "Impact of Defect Distribution on Resistive Switching Characteristics of $Sr_2TiO_4$ Thin Films," *Adv. Mater.* 22, pp. 411-414 (2010).
30. Muenstermann et al., "Coexistence of Filamentary and Homogeneous Resistive Switching in Fe-doped $SrTiO_3$ Thin-Film Memristive Devices," *Adv. Mater.* 22, pp. 4819-4822 (2010).
31. Menzel et al., "Origin of the Ultra-nonlinear Switching Kinetics in Oxide-Based Resistive Switches," *Adv. Funct. Mater.* 21, pp. 4487-4492 (2011).
32. Nian et al., "Evidence for an Oxygen Diffusion Model for the Electric Pulse Induced Resistance Change Effect in Transition-Metal Oxides," *Phys. Rev. Lett.* 98, pp. 146403-1 through 146403-4 (2007), published Apr. 4, 2007.
33. Miao et al., "Observation of two resistance switching modes in $TiO_2$ memristive devices electroformed at low current," *Nanotechnology* 22, pp. 254007-1 through 254007-7 (2011) published May 16, 2011.
34. Strukov et al., "Exponential ionic drift: fast switching and low volatility of thin-film memristors," *Appl. Phys. A* 94, pp. 515-519 (2009), published online Nov. 28, 2008.

What is claimed is:
1. An article comprising:
a substrate having a surface;
a film on the surface of said substrate, the film comprising a plurality of aligned nanocolumns of $Sm_2O_3$ embedded in a matrix of $SrTiO_3$, the film further characterized as comprising a vertical interface separating the nanocolumns from the matrix, said interface further characterized as comprising an oxygen deficient channel suitable for providing said article with memristive properties.

2. The article of claim 1, wherein the substrate comprises a doped $SrTiO_3$.

3. The article of claim 1, wherein the substrate is a multilayered substrate.

4. The article of claim 3, wherein the multilayered substrate comprises a first layer of silicon, a second layer of silicon dioxide on the silicon layer, a third layer of IBAD-MgO on the $SiO_2$ layer, and the fourth layer of $SrRuO_3$ on the IBAD-MgO layer.

5. The article of claim 3, wherein the multilayered substrate comprises a first layer of silicon, a second layer of silicon dioxide on the silicon layer, a third layer of IBAD-MgO on the silicon dioxide layer, and a fourth layer of niobium-doped $SrTiO_3$ on the IBAD-MgO layer.

6. The article of claim 3, wherein the multilayered substrate comprises a first layer of silicon, a second layer of silicon dioxide on the silicon layer, a third layer of IBAD-MgO on the silicon dioxide layer, and a fourth layer of $La_{0.5}Sr_{0.5}CoO_3$ on the layer of IBAD-MgO.

7. An article prepared by a process comprising:
providing a target material comprising a mixture of $Sm_2O_3$ and $SrTiO_3$; and
using the target material to deposit a film onto a surface of a substrate by pulsed laser deposition, the film comprising a plurality of aligned nanocolumns of $Sm_2O_3$ embedded in a matrix of $SrTiO_3$.

8. The article of claim 7, wherein the substrate comprises a doped $SrTiO_3$.

9. The article of claim 7, wherein the substrate is a multilayered substrate.

10. The article of claim 9, wherein the multilayered substrate comprises a first layer of silicon, a second layer of silicon dioxide on the silicon layer, a third layer of IBAD-MgO on the $SiO_2$ layer, and the fourth layer of $SrRuO_3$ on the IBAD-MgO layer.

11. The article of claim 9, wherein the multilayered substrate comprises a first layer of silicon, a second layer of silicon dioxide on the silicon layer, a third layer of IBAD-MgO on the silicon dioxide layer, and a fourth layer of niobium-doped $SrTiO_3$ on the IBAD-MgO layer.

12. The article of claim 9, wherein the multilayered substrate comprises a first layer of silicon, a second layer of silicon dioxide on the silicon layer, a third layer of IBAD-MgO on the silicon dioxide layer, and a fourth layer of $La_{0.5}Sr_{0.5}CoO_3$ on the layer of IBAD-MgO.

13. An article comprising:
a substrate having a surface; and
a film on the surface of the substrate, the film comprising a plurality of nanocolumns of a first metal oxide material embedded in a matrix of a second metal oxide material, the film further characterized as comprising a vertical interface separating the nanocolumn of the first metal oxide from the matrix of the second metal oxide, said interface further characterized as comprising an oxygen deficient channel suitable for providing said article with memristive properties.

14. The article of claim 13, wherein the substrate comprises a doped $SrTiO_3$.

15. The article of claim 14, wherein the matrix comprises $SrTiO_3$.

16. The article of claim 15, wherein the first metal oxide comprises $Sm_2O_3$.

17. The article of claim 16, wherein the second metal oxide is selected from $Ba_{0.6}Sr_{0.4}TiO_3$ and $BaTiO_3$.

18. The article of claim 13, wherein the substrate is multilayered and comprises a first layer of silicon, a second layer of silicon dioxide on the silicon layer, a third layer of IBAD-MgO on the $SiO_2$ layer, and the fourth layer of $SrRuO_3$ on the IBAD-MgO layer.

19. The article of claim 13, wherein the substrate is multilayered and comprises a first layer of silicon, a second layer of silicon dioxide on the silicon layer, a third layer of IBAD-MgO on the silicon dioxide layer, and a fourth layer of niobium-doped $SrTiO_3$ on the IBAD-MgO layer.

20. The article of claim 13, wherein the substrate is multilayered and comprises a first layer of silicon, a second layer of silicon dioxide on the silicon layer, a third layer of IBAD-MgO on the silicon dioxide layer, and a fourth layer of $La_{0.5}Sr_{0.5}CoO_3$ on the layer of IBAD-MgO.

\* \* \* \* \*